United States Patent
Folkes

(10) Patent No.: US 6,541,803 B1
(45) Date of Patent: Apr. 1, 2003

(54) HIGH-SPEED HIGH ELECTRON MOBILITY TRANSISTOR PHOTODETECTOR USING LOW TEMPERATURE GALLIUM ARSENIDE

(75) Inventor: Patrick A. Folkes, Princeton Junction, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 09/556,152

(22) Filed: Apr. 21, 2000

(51) Int. Cl.$^7$ .............................................. H01L 31/112
(52) U.S. Cl. ........................ 257/187; 257/194; 438/172
(58) Field of Search ................................. 257/184, 187, 257/189, 192, 194, 201, 431, 609; 438/172

(56) References Cited

U.S. PATENT DOCUMENTS

| | | | |
|---|---|---|---|
| 5,051,804 A | * 9/1991 | Morse et al. | 357/30 |
| 5,161,235 A | * 11/1992 | Shur et al. | 257/24 |
| 5,485,018 A | * 1/1996 | Ogawa et al. | 257/24 |
| 6,160,274 A | * 12/2000 | Folkes | 257/191 |

FOREIGN PATENT DOCUMENTS

JP  8-316522  * 11/1996  ........... H01L/31/10

OTHER PUBLICATIONS

Chen et al., New Minority Hole Sinked Photoconductive Detector, Dec. 15, 1983, Appl. Phys. Lett. 43(12), pp. 1115–1117.*
Banba et al., Fundamental Properties of HEMT Photodetector for Uei In Fiber Optic Links, 1992, Proc. 22 European Microwave Conf., pp. 747–750.*

* cited by examiner

Primary Examiner—Eddie Lee
Assistant Examiner—Bradley Baumeister
(74) Attorney, Agent, or Firm—Mark Kelly; Edward L. Stolarun

(57) ABSTRACT

A high electron mobility transistor photodetector includes an undoped GaAs buffer, a p-type GaAs layer positioned above the undoped GaAs buffer that is between 0.5 to 1 $\mu$m in thickness, an undoped low temperature GaAs layer positioned above the p-type GaAs layer, an undoped GaAs layer positioned above the low temperature GaAs layer, a layer of undoped InGaAs positioned above the undoped GaAs layer, a layer of undoped AlGaAs positioned above the layer of InGaAs, an n+ AlGaAs charge-suppling layer positioned above the layer of undoped AlGaAs, an n+ GaAs contact layer positioned above the n+ AlGaAs charge-supplying layer, and source and drain ohmic contacts positioned above the n+ GaAs contact layer. A negative bias voltage is applied to the p-type GaAs layer to sweep the holes from the photo-absorptive layer which greatly increases the speed and responsiveness of the device.

4 Claims, 1 Drawing Sheet

HIGH-SPEED HIGH ELECTRON MOBILITY TRANSISTOR PHOTODETECTOR USING LOW TEMPERATURE GALLIUM ARSENIDE

BACKGROUND OF THE INVENTION

This application is related to applicant's co-pending application Ser. No. 09/548,388, filed on Apr. 11, 2000, commonly assigned with the present invention. The field of this invention is high speed 0.8 micron (μm) infrared photodetectors. Its purpose is to achieve an increased high frequency response of the high electron mobility transistor photodetector (HEMT-PH) without any degradation in the responsivity. Known HEMT-PH devices exhibit a relatively low maximum response frequency when used in the photodetector mode compared to the maximum response frequency when the device is used as a high electron mobility transistor (HEMT). The relatively low maximum response frequency of the HEMT-PD has been attributed to slow drift velocity of photoexcited minority holes which are present in the HEMT-PD buffer layer. For background, see, S. Banba, E. Suematsu, and H. Ogawa, *Proc. 22 European Microwave Conf.*, 747 (1992), incorporated herein by reference as if fully set forth. Devices according to the present invention solve the problem of slow drift velocity of photoexcited minority holes in the HEMT-PD buffer layer thus resulting in a faster, more sensitive HEMT-PD than has been achieved in the past. HEMT-PDs of the present application will exhibit much higher photocurrent gain than photoconductive detectors due to the combination of photoconductive and photovoltaic effects on the photcurrent in the HEMT-PD channel as well as the high electron mobility of the HEMT-PD due to the use of modulation doping in the HEMT-PD heterostructure. Modulation doping in the HEMT-PD results in a higher channel electron mobility, higher saturated channel current and a shorter electron transit time; which combine to giver a greater photocurrent gain than the photoconductive detector.

GaAs grown at low temperatures (LT-GaAs), i.e., GaAs layers grown by molecular beam epitaxy at substrate temperatures of 250–300° C., is known to exhibit very short carrier lifetimes (<1ps) and semi-insulating behavior after annealing. Therefore, this material is may be used to increase the capture rate of photogenerated holes in the GaAs photo absorption region resulting in a faster removal of holes from the absorption region and an increased speed HEMT-PD. A disadvantage of LT GaAs is the higher cost of fabrication.

HEMT-PDs according to the present invention have many possible applications. For example, they can be used as a 0.8 micron photodetector in optoelectronic integrated circuit receivers which are used in short wavelength fiber optic subcarrier transmission links in personal communication systems. They can also be used in optical local area networks, optical signal processors, distributed fiber optic sensors, cable television networks and satellite communication systems. The devices are compatible with monolithic microwave integrated circuits.

The invention of this application increases the HEMT-PD's high frequency response and sensitivity by using an LT GaAs layer to increase the capture rate of photoexcited holes and a negatively biased substrate electrode to increase the drift velocity of the photoexcited holes resulting in a faster removal of holes from the photo-absorption region. While the use of a substrate bias voltage was first proposed to decrease the fall time of a simple photoconductive detector, it has not been applied to a HEMT-PD. For background, see, C. Y. Chen, Y. Pang, A. Cho and P. Garbinski, *Appl. Phys. Lett.* 43, 1115 (1983).

OBJECTS OF THE INVENTION AND SUMMARY

The principal object of the invention is to achieve an increase in the maximum response frequency of the detector. Another object is to achieve a reduction in the high frequency device noise. These and other objects are achieved, at least in part, by a high electron mobility transistor photodetector which includes a GaAs undoped substrate, a p-type GaAs layer positioned above the GaAs substrate that is between 0.5 to 1 μm in thickness, an undoped low temperature GaAs layer positioned above the p-type GaAs layer, an undoped GaAs layer buffer positioned above the undoped low temperature GaAs (LT GaAs) layer, a layer of undoped InGaAs positioned above the undoped GaAs layer, a layer of undoped AlGaAs positioned above the layer of InGaAs, an n+ AlGaAs charge-supplying layer positioned above the layer of undoped AlGaAs, an n+ GaAs contact layer positioned above the n+ AlGaAs charge-supplying layer, and source and drain ohmic contacts positioned above the n+ GaAs contact layer. In a preferred embodiment, the high electron mobility transistor photodetector also includes an ohmic contract for supplying a negative bias voltage to the p-type GaAs layer.

BRIEF DESCRIPTION OF THE DRAWING

The foregoing objects and advantages of the present invention will be more fully understood from the following detailed description having reference to the appended drawing wherein.

DETAILED DESCRIPTION

Figure 1:
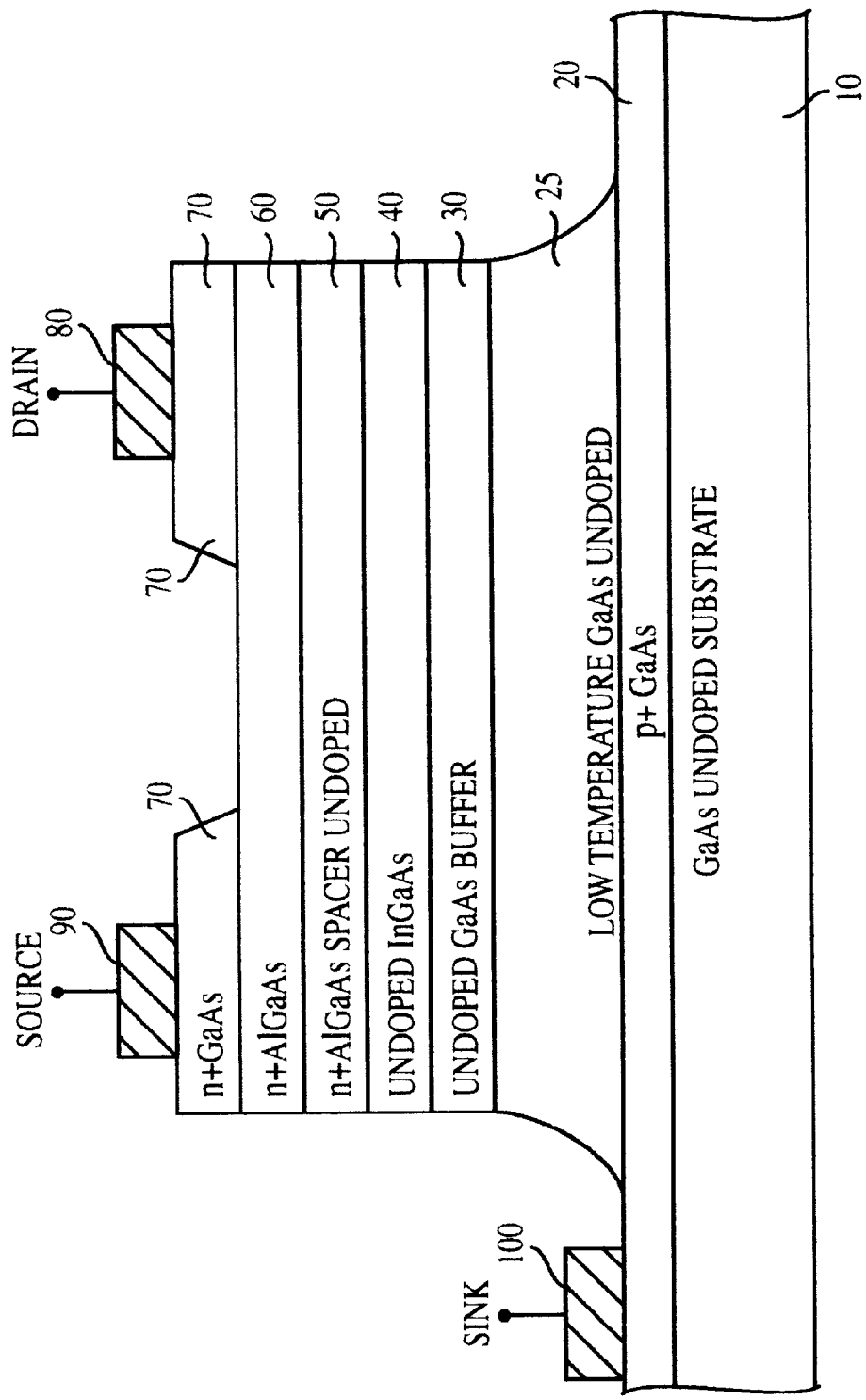
FIG. 1 shows a schematic drawing of a preferred embodiment of the HEMT-PD device.

With reference to FIG. 1, the following epitaxial layers of HEMT-PD 5 are grown by molecular beam epitaxy on an undoped GaAs substrate 10: a p-type GaAs layer 20 positioned above undoped GaAs substrate 10, which should be between 0.5 to 1 μm in thickness; layer 25 of undoped low temperature GaAs positioned above p-type GaAs layer 20; layer 30 of undoped GaAs approximately 2 μm in thickness, which is the photo-absorption region and is positioned above undoped low temperature GaAs layer 25; layer 40 of InGaAs approximately 100 Å in thickness positioned above undoped GaAs layer 30; layer 50 of undoped AlGaAs approximately 30 Å in thickness positioned above layer 40 of InGaAs; n+ AlGaAs charge-supplying layer 60 positioned above layer 50 of undoped AlGaAs; and n+ GaAs contact layer 70 positioned above n+ AlGaAs charge-supplying layer 60.

Ohmic drain and source contacts 80 and 90 for the photocurrent are positioned above n+ AlGaAs charge-suppling layer 60. In addition, ohmic contact 100 positioned above p+ GaAs layer 20 permits application of a negative bias of between 1–3 volts to the region to increase the drift velocity of the photoexcited holes resulting in a much faster removal of holes from the photo-absorption region. Faster removal of the holes from the photo-absorptive region 30 greatly increases the speed of the HEMT-PD.

Having thus shown and described what are at present considered to be preferred embodiments of the present invention, it should be noted that the same have been made by way of illustration and not limitation. Accordingly, all modifications, alterations and changes coming within the spirit and scope of the present invention are herein meant to be included.

What is claimed is:

1. A high electron mobility transistor photodetector comprising:

a GaAs undoped substrate;

a p-type GaAs layer positioned above the GaAs substrate;

an undoped low temperature GaAs layer positioned above the p-type GaAs layer;

an undoped GaAs buffer layer positioned above the undoped low temperature GaAs layer;

a layer of undoped InGaAs positioned above the undoped GaAs buffer layer;

a layer of undoped AlGaAs positioned above the layer of undoped InGaAs;

an n+ AlGaAs charge-supplying layer positioned above the layer of undoped AlGaAs;

an n+ GaAs contact layer positioned above the n+ AlGaAs charge-supplying layer; and source and drain ohmic contacts positioned above the n+ GaAs contact layer.

2. A high electron mobility transistor photodetector according to claim 1 further comprising an ohmic contact for supplying a bias voltage to the p-type GaAs layer.

3. A high electron mobility transistor photodetector according to claim 1 wherein the p-type GaAs layer positioned above the GaAs substrate is between 0.5 to 1 $\mu$m in thickness.

4. A method of improving the response of a high electron mobility transistor photodetector which comprises a layer of p-type GaAs beneath a photo-absorption layer, comprising:

applying a negative bias voltage to the p-type GaAs layer to increase a drift velocity of photoexcited holes in the photo absorption layer, and positioning a low temperature GaAs layer above the p-type GaAs layer to enhance the capture rate of photoexcited holes.

* * * * *